(12) United States Patent
Chen et al.

(10) Patent No.: US 8,575,035 B2
(45) Date of Patent: Nov. 5, 2013

(54) METHODS OF FORMING VARYING DEPTH TRENCHES IN SEMICONDUCTOR DEVICES

(75) Inventors: Gang Chen, San Jose, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/402,674

(22) Filed: Feb. 22, 2012

(65) Prior Publication Data

US 2013/0217173 A1    Aug. 22, 2013

(51) Int. Cl.
*H01L 31/02* (2006.01)
*H01L 21/76* (2006.01)

(52) U.S. Cl.
USPC ............. 438/738; 438/73; 438/427; 438/704; 438/424; 257/E21.548

(58) Field of Classification Search
USPC ................................. 438/738, 427
See application file for complete search history.

(56) References Cited

U.S. PATENT DOCUMENTS

| | | | | |
|---|---|---|---|---|
| 5,034,347 A * | 7/1991 | Kakihana | ...................... | 438/667 |
| 6,596,608 B2 * | 7/2003 | Saito | .............. | 438/424 |
| 6,967,364 B2 * | 11/2005 | Hong | ............................ | 257/292 |
| 6,989,561 B2 * | 1/2006 | Lin et al. | ....................... | 257/301 |
| 8,138,530 B2 | 3/2012 | Park et al. | | |
| 2003/0129840 A1 * | 7/2003 | Kumar et al. | .................. | 438/694 |
| 2006/0046406 A1 * | 3/2006 | Chindalore et al. | .......... | 438/301 |
| 2007/0037100 A1 * | 2/2007 | Falterrneier et al. | .......... | 430/313 |
| 2008/0268608 A1 * | 10/2008 | Kim et al. | ...................... | 438/424 |
| 2009/0010075 A9 * | 1/2009 | Prall et al. | ................ | 365/185.29 |
| 2009/0315137 A1 * | 12/2009 | Kwon et al. | ................... | 257/446 |
| 2010/0184295 A1 * | 7/2010 | Sato et al. | ...................... | 438/702 |
| 2010/0255612 A1 * | 10/2010 | Inoue et al. | ........................ | 438/5 |
| 2012/0164783 A1 | 6/2012 | Park et al. | | |

OTHER PUBLICATIONS

Highly selective etching of silicon nitride over silicon and silicon dioxide B. E. E. Kastenmeier, P. J. Matsuo, and G. S. Oehrlein, J. Vac. Sci. Technol. A 17, 3179 (1999), DOI:10.1116/1.582097.*
Highly selective etching of silicon nitride over silicon and silicon dioxide B. E. E. Kastenmeier, P. J. Matsuo, and G. S. Oehrlein, J. Vac. Sci. Technol. A 17, 3179 (1999), DOI: 10.1116/1.582097.*

* cited by examiner

*Primary Examiner* — Charles Garber
*Assistant Examiner* — Regan J Rundio
(74) *Attorney, Agent, or Firm* — Blakely Sokoloff Taylor & Zafman LLP

(57) ABSTRACT

A method of forming trenches in a semiconductor device includes forming an etchant barrier layer above a first portion of a semiconductor layer. A first trench is etched in a second portion of the semiconductor layer using a first etchant. The second portion of the semiconductor layer is not disposed underneath the etchant barrier layer. The etchant barrier layer is etched through using a second etchant that does not substantially etch the semiconductor layer. A second trench is etched in the first portion of the semiconductor layer using a third etchant. The third etchant also extends a depth of the first trench.

16 Claims, 8 Drawing Sheets

ETCH (DEEPER) PERIPHERAL TRENCH

REMOVE PHOTORESIST AND NITRIDE

GLOBAL ETCH

COVER PIXEL ARRAY TRENCH WITH PHOTORESIST

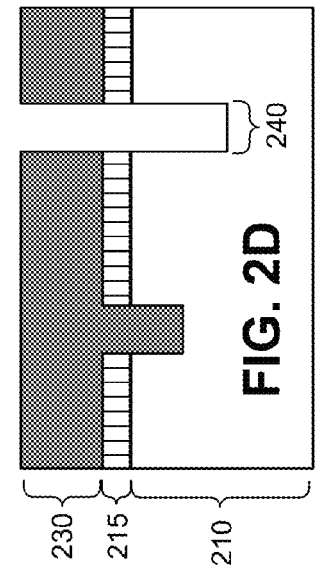
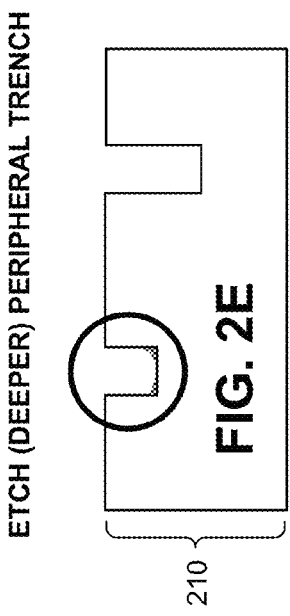
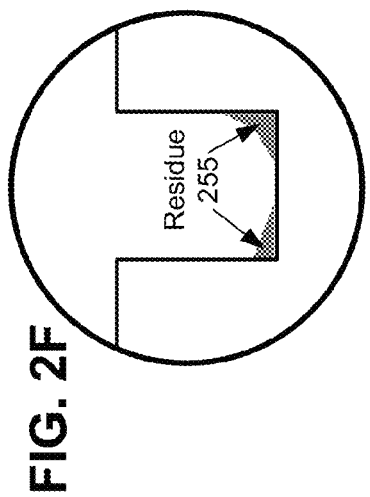
FIG. 2D
ETCH (DEEPER) PERIPHERAL TRENCH
FIG. 2E
REMOVE PHOTORESIST AND NITRIDE
FIG. 2F
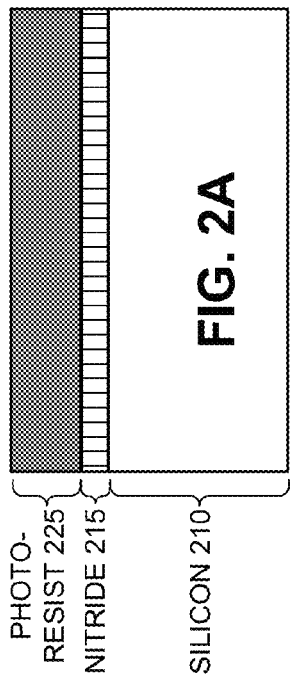
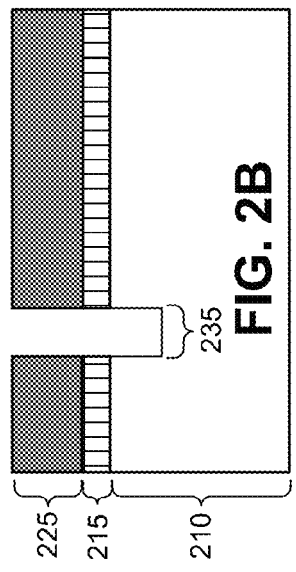
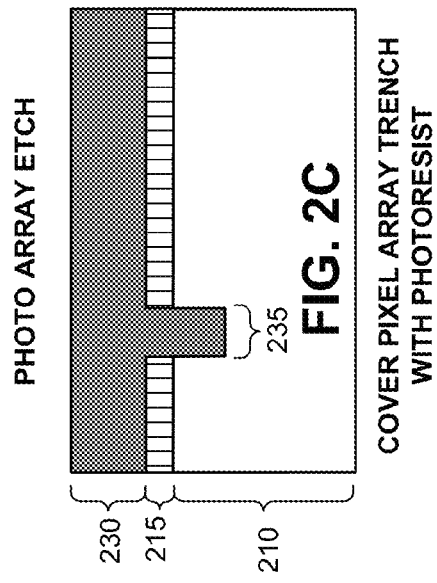
FIG. 2A
FIG. 2B
PHOTO ARRAY ETCH
FIG. 2C
COVER PIXEL ARRAY TRENCH WITH PHOTORESIST

DEPOSIT NITRIDE ON SILICON

DEPOSIT OXIDE ON A PORTION OF NITRIDE

DEPOSIT PHOTORESIST

REMOVE PHOTORESIST AND OXIDE

FILL PIXEL ARRAY AND PERIPHERAL TRENCHES WITH OXIDE

REMOVE EXCESS OXIDE AND NITRIDE TO LEAVE DUAL DEPTH OXIDE FILLED TRENCHES

METHODS OF FORMING VARYING DEPTH TRENCHES IN SEMICONDUCTOR DEVICES

TECHNICAL FIELD

This disclosure relates generally to semiconductor devices and in particular but not exclusively, relates to image sensors.

BACKGROUND INFORMATION

Semiconductor devices such as image sensors are widely used in digital still cameras, cellular phones, security cameras, as well as in, medical, automobile, and other applications. Complementary metal-oxide-semiconductor ("CMOS") technology is used to manufacture lower cost semiconductor devices such as image sensors on silicon substrates. In a large number of image sensors, the image sensor commonly includes hundreds, thousand or even millions of light sensor cells or pixels. A typical individual pixel includes a micro-lens, a filter, a photosensitive element, a floating diffusion region, and one or more transistors for reading out a signal from the photosensitive element. As semiconductor devices such as image sensors become smaller and smaller, isolating electrical signals between electrical components within the semiconductor device becomes more important.

Fabricating semiconductor devices often includes forming trenches in a semiconductor layer of the semiconductor device. The trenches formed are used in a variety of applications including shallow trench isolation ("STI"). STI can help isolate adjacent electrical components disposed in the same semiconductor layer by reducing the electrical current leakage between components. In some applications, it is desirable to have many trenches in the same semiconductor layer, and for the trenches to have varying depths. For example, in an image sensor, it may be desirable for the trenches between each pixel in a pixel array to have a shorter depth than the trenches between the pixel array and a peripheral circuit region that contains circuit elements that control the pixel array. Therefore, with the demand for varying depth trenches in semiconductor devices, an inexpensive way to form precision trenches is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 2A-2F are cross-sectional side views illustrating different stages in a method of forming trenches of varying depths, which includes two photo etches, in accordance with an embodiment of the disclosure.

DETAILED DESCRIPTION

Embodiments of a method for forming trenches of varying depths in a semiconductor layer are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
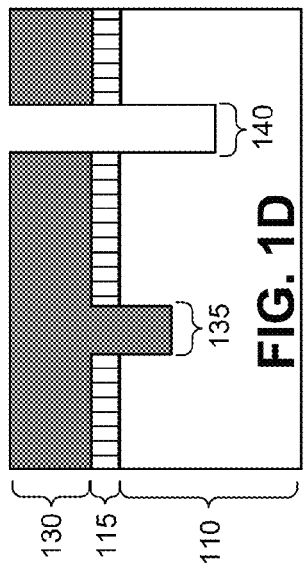
FIGS. 1A-1F are cross-sectional side views illustrating different stages in a method of forming trenches of varying depths, which includes a global etch, in accordance with an embodiment of the disclosure.
Figure 1D:
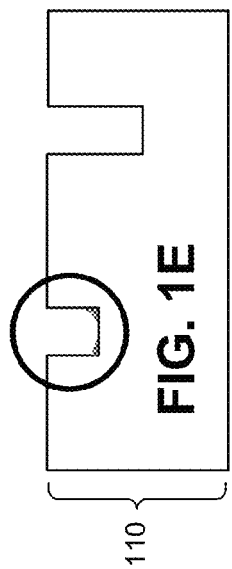
Figure 1E:
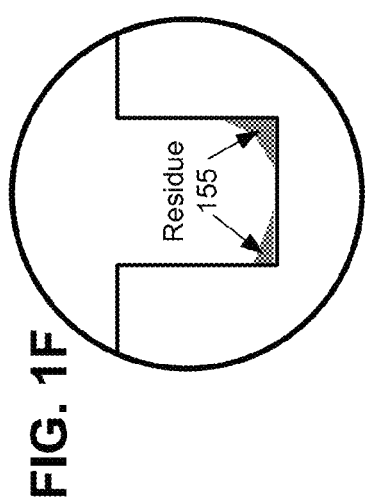
Figure 1B:
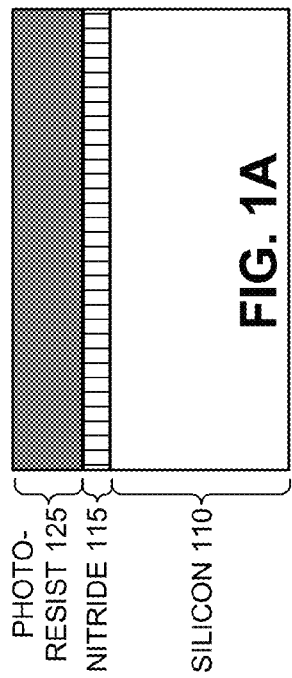

FIGS. 1A-1F show a method (referred to herein as "global etch method") of forming two trenches with varying depths in a semiconductor in accordance with an embodiment of the disclosure. The illustrated embodiment shows a portion of an image sensor being formed, but the method could be applied to other semiconductor devices. FIG. 1A shows a silicon layer 110 (as a semiconductor layer) with a nitride layer 115 and a photoresist layer 125 stacked on top of silicon layer 110. Silicon layer 110, nitride layer 115, and photoresist layer 125 form the start of an image sensor that may be a part of a wafer that will contain several image sensors. FIG. 1B shows that a global etch process has formed pixel array trench 135 and peripheral trench 140. Pixel array trench 135 and peripheral trench 140 have approximately the same depth in silicon layer 110 because they were formed by the same global etch process. The global etch may have included patterning photoresist layer 125 using photolithography. The photolithography may have been followed by exposing the wafer to an etchant that etches nitride layer 115. A second etchant that etches silicon may have been utilized subsequent to the etchant that etched nitride layer 115.

Figure 1C:
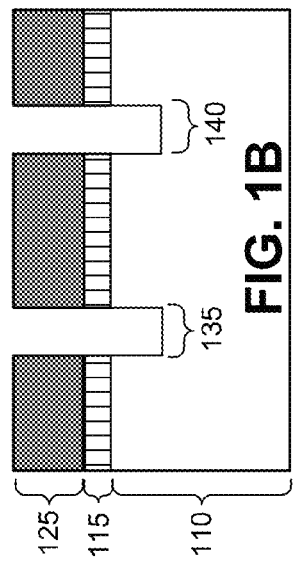
Figure 1F:
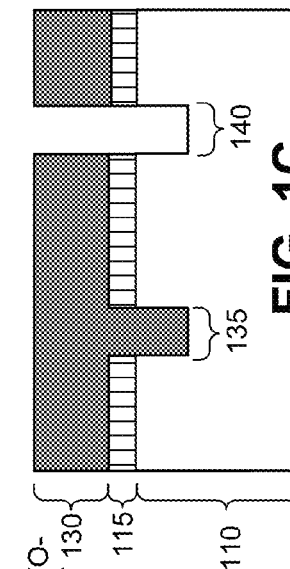

In FIG. 1C, more photoresist is deposited onto the start of the image sensor, and the new photoresist covers pixel array trench 135. Pixel array trench 135 may separate pixels in a pixel array. The new photoresist deposited combined with the photoresist layer 125 is illustrated as photoresist layer 130. FIG. 1D shows that peripheral trench 140 has been etched to a depth that is deeper than pixel array trench 135. This is because an etchant applied to the image sensor was able to access peripheral trench 140, but pixel array trench 135 was covered by photoresist and not etched. In FIG. 1E, photoresist layer 130 and nitride layer 115 has been largely removed. FIG. 1F shows a potential drawback of the global etch method. FIG. 1F provides an exploded view of pixel array trench 135 that shows the possibility that not all of photoresist layer 130 was removed from pixel array trench 135. Residue 155 from photoresist layer 130 may remain inside pixel array trench 135.

FIGS. 2A-2F show a method (referred to herein as "double photo-double etch method") of forming two trenches with varying depths in a semiconductor layer in accordance with an embodiment of the disclosure. The illustrated embodiment shows a portion of an image sensor being formed, but the method could be applied to other semiconductor devices. FIG. 2A shows silicon layer 210 with nitride layer 215 and photoresist layer 225 stacked on top of silicon layer 210. Silicon layer 210, nitride layer 215, and photoresist layer 225 form the start of an image sensor that may be a part of a wafer that will contain several image sensors. FIG. 2B shows that pixel array trench 235 has been etched. Etching pixel array trench 235 may have included patterning photoresist layer 225 using photolithography to include an opening above pixel array trench 235. The photolithography may have been followed by exposing the wafer to an etchant that etches nitride layer 215 below the opening patterned in photoresist layer 225. A second etchant that etches silicon may have followed the etchant that etched nitride layer 215.

In FIG. 2C, photoresist is deposited onto the start of the image sensor, and the new photoresist covers pixel array trench 235. The new photoresist deposited combined with the photoresist layer 225 is illustrated as photoresist layer 230. FIG. 2D shows that peripheral trench 240 has been etched. Etching peripheral trench 240 may have included patterning photoresist layer 230 using a second photolithography step to include an opening above peripheral trench 240. The photolithography may have been followed by exposing the wafer to an etchant that etches nitride layer 215 below an opening (not shown) patterned in photoresist layer 230. A second etchant that etches silicon may have followed the etchant that etched nitride layer 215. Peripheral trench 240 is deeper than pixel array trench 235. Peripheral trench 240 may be deeper than pixel array trench 235 because peripheral trench 240 was exposed for a longer period of time to an etchant that etches silicon than the time period that pixel array trench 235 was exposed to an etchant that etches silicon. In FIG. 2E, photoresist layer 230 and nitride layer 215 have been largely removed. FIG. 2F shows a potential drawback of the double photo-double etch method. FIG. 2F provides an exploded view of pixel array trench 235 that shows the possibility that not all of photoresist layer 230 was removed from pixel array trench 235. Residue 255 from photoresist layer 130 may remain inside pixel array trench 135.

Both the global etch method and double photo-double etch method may leave photoresist residue in the trenches. The residue left in the trenches may be undesirable because it may cause ionic contamination of the substrate. In addition, the global etch method depicted in FIG. 1A-1F may compromise the desired shape of peripheral trench 140. Specifically, the sidewall profiles of peripheral trench 140 may be altered by deposition and removal of polymer on the sidewalls in connection with a second deposition of photoresist. The double photo-double etch method depicted in FIG. 2A-2F may be relatively expensive because it involves two photolithography process steps which increases tooling cost.

Figure 3A:
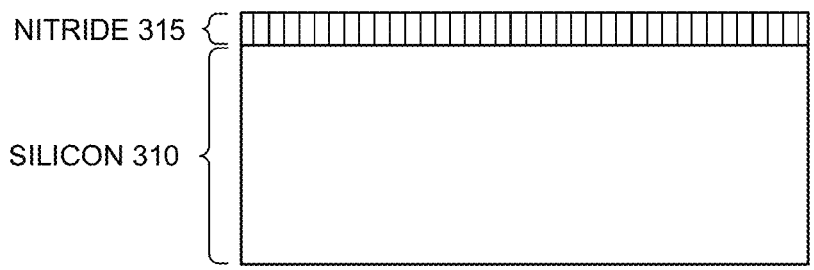
FIGS. 3A-3L are cross-sectional side views illustrating different stages of a process of forming trenches of varying depths, in accordance with an embodiment of the disclosure.

FIGS. 3A-3L are cross-sectional side views illustrating different stages of a process of forming trenches of varying depths, in accordance with an embodiment of the disclosure. FIG. 3A shows an initial part of the process, which begins with a nitride layer 315 disposed over a semiconductor layer. In FIG. 3A, the semiconductor layer is silicon layer 310, but other semiconductor materials are possible. Nitride layer 315 may be formed on silicon layer 310 using conventional processes (e.g. chemical vapor deposition). FIG. 3A only shows a portion of silicon layer 310. Silicon layer 310 may be part of a wafer that will have multiple die sites to form multiple semiconductor devices.

Figure 3B:
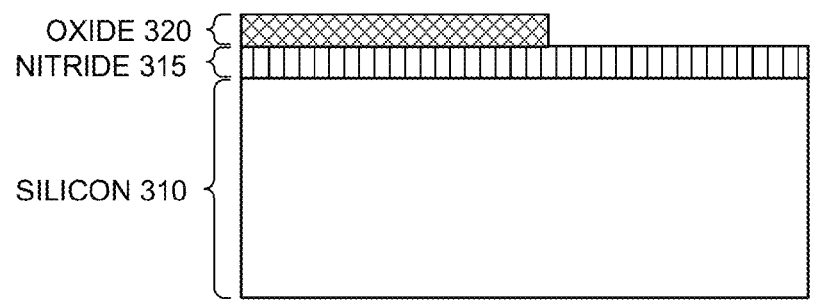

FIG. 3B illustrates a next part of the process. Starting with the build-up shown in FIG. 3A, an oxide layer 320 is deposited onto a portion of nitride layer 315. Oxide layer 320 serves as an etchant barrier layer that controls when the silicon underneath oxide layer 320 is etched in an etching sequence. Specifically, until oxide layer 320 is exposed to an etchant with the chemical properties to etch oxide layer, oxide layer 320 prevents the silicon (and nitride) underneath it from being etched. In one embodiment, oxide layer 320 and nitride layer 315 switch positions so that an oxide layer is between silicon layer 310 and a nitride layer, and thus the nitride layer 315 is the etchant barrier layer.

Figure 3C:
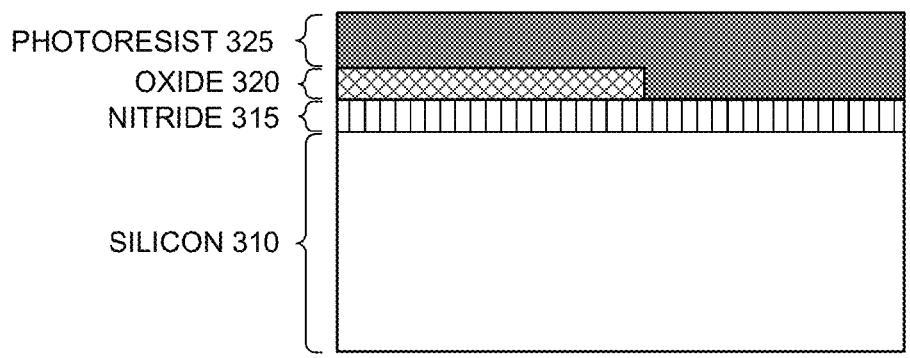

FIG. 3C illustrates a next part of the process. Starting with the build-up in FIG. 3B, a photoresist layer 325 is formed over oxide layer 320 and nitride layer 315.

Figure 3D:
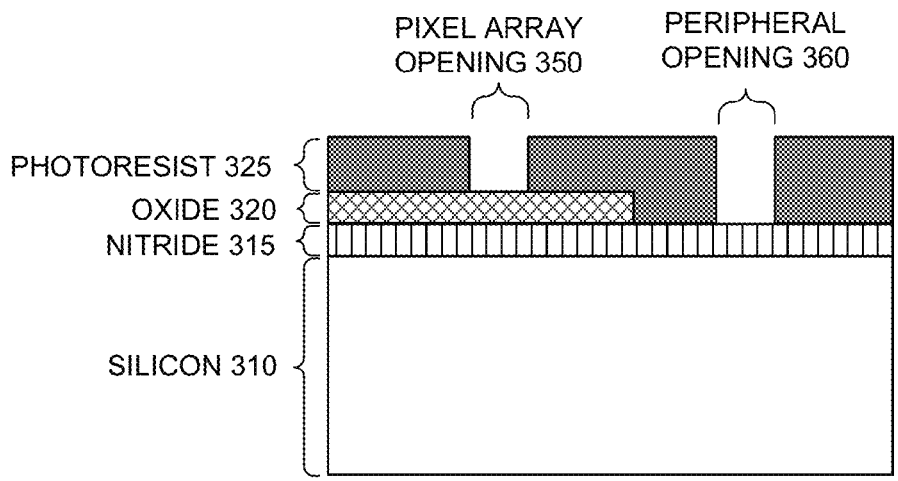

FIG. 3D illustrates a next part of the process. Starting with the build-up in FIG. 3C, pixel array opening 350 and peripheral opening 360 are formed in photoresist layer 325. Pixel array opening 350 and peripheral opening 360 may be formed in photoresist layer 325 as a result of photolithography. Other ways of forming pixel array opening 350 and peripheral opening 360 are possible. Pixel array opening 350 helps determine the placement and the width of a pixel array trench 380 that will be formed below pixel array opening 350. Pixel array trench 380 may be used to electrically isolate pixels in a pixel array. Peripheral opening 360 helps determine the placement and the width of a peripheral trench 390 that will be formed below peripheral opening 360. Peripheral trench 390 may be used to electrically isolate the pixel array from peripheral circuits that control the pixel array. Pixel array opening 350 exposes a portion of oxide layer 320 and peripheral opening 360 exposes a portion of nitride layer 315.

Figure 3E:
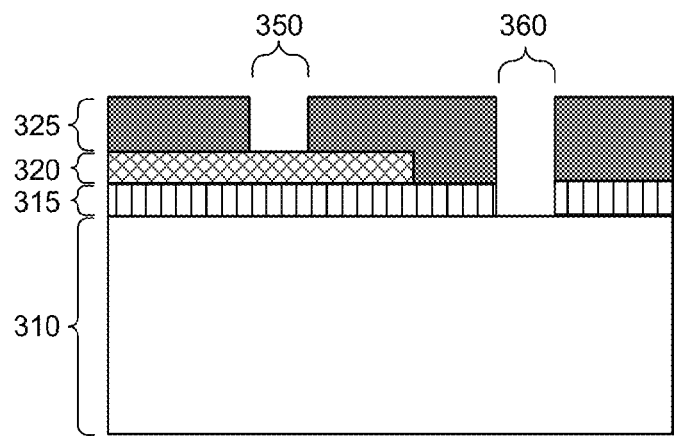

FIG. 3E illustrates a next part of the process. Starting with the build-up shown in FIG. 3D, the portion of nitride layer 315 underneath peripheral opening 360 is etched away by an etchant. The chemical properties of the etchant will not substantially etch oxide layer 320, but will etch nitride layer 315. Fluorine gas may be used as the etchant, although other etchants are possible. If silicon layer 310 is part of a wafer, the wafer is placed in an etchant chamber and may be exposed to fluorine gas. Even though the wafer is exposed to the etchant (e.g. fluorine gas), the chemical properties of the etchant don't substantially etch oxide layer 320, and it stays largely intact. The newly etched gap in nitride layer 315 is approximately the same width as, and is vertically aligned with, peripheral opening 360.

Figure 3F:
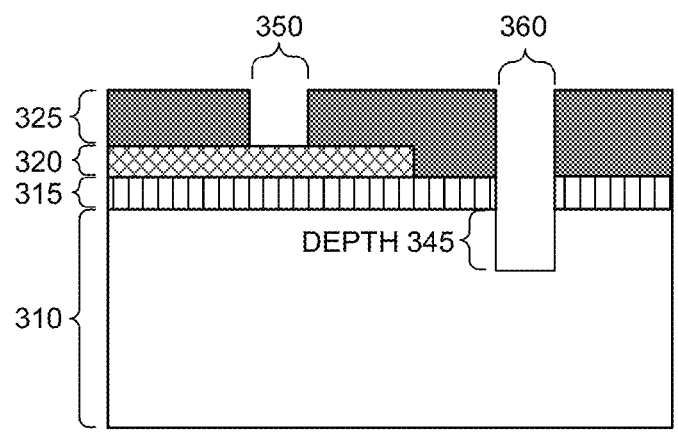

FIG. 3F illustrates a next part of the process. Starting with the build-up shown in FIG. 3E, a portion of silicon layer 310 underneath peripheral opening 360 is etched away forming the start of peripheral trench 390 in silicon layer 310 with a depth 345. The newly etched start of peripheral trench 390 in silicon layer 310 is approximately the same width as, and is vertically aligned with, peripheral opening 360. Peripheral trench 390 may help electrically isolate a pixel array that will be formed in silicon layer 310 from peripheral circuits that will be formed in silicon layer 310. The chemical properties of the etchant used to etch the start of peripheral trench 390 will not substantially etch oxide layer 320, but will etch silicon layer 310. Chlorine gas may be used as the etchant to etch silicon layer 310.

Figure 3G:
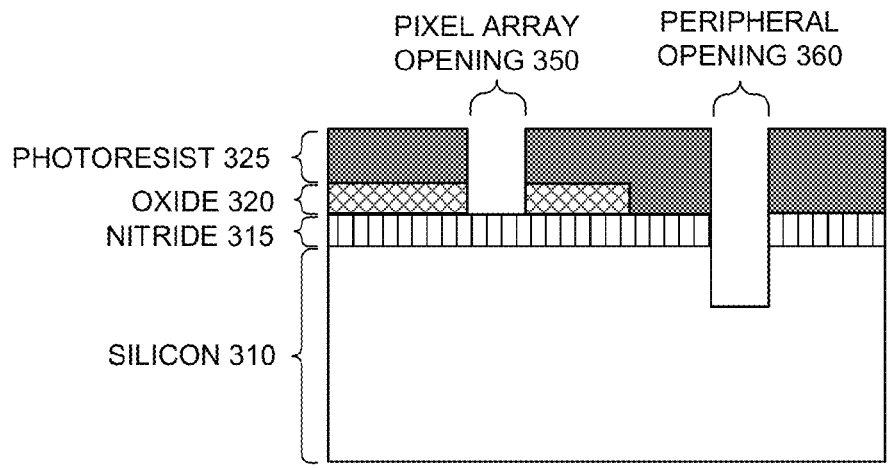

FIG. 3G illustrates a next part of the process. Starting with the build-up shown in FIG. 3F, the portion of oxide layer 320 underneath pixel array opening 350 is etched away by an etchant. A wet etch or dry etch may be used to remove the portion of oxide layer 320 underneath pixel array opening 350. Fluorine-plasma etch is an example dry etch method that may be used. The chemical properties of the etchant will not substantially etch silicon layer 310, but will etch oxide layer 320. The newly etched gap in oxide layer 320 is approximately the same width as, and is vertically aligned with, pixel array opening 350.

Figure 3H:
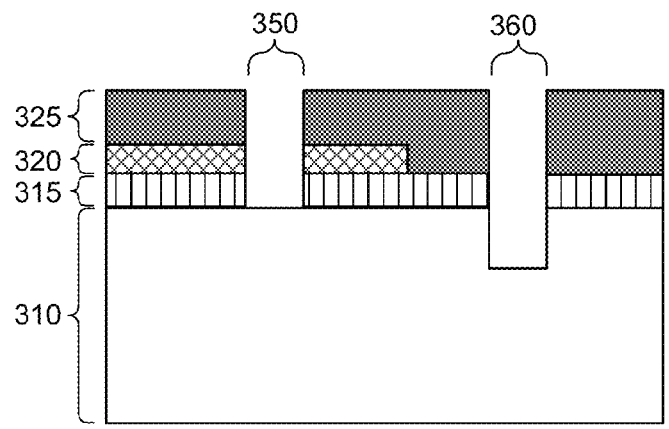

FIG. 3H illustrates a next part of the process. Starting with the build-up shown in FIG. 3G, the portion of nitride layer 315 underneath pixel array opening 350 is etched away by an etchant. The etchant's chemical properties will not substantially etch silicon layer 310, but will etch nitride layer 315.

Fluorine gas may be used as the etchant, although other etchants may be used. If silicon layer 310 is part of a wafer, the wafer is placed in an etchant chamber and may be exposed to fluorine gas. Even though the wafer is exposed to the etchant (e.g. fluorine gas), the chemical properties of the etchant don't substantially etch silicon layer 310, and it stays largely intact. The newly etched gap in nitride layer 315 is approximately the same width as, and is vertically aligned with, pixel array opening 350.

Figure 3I:
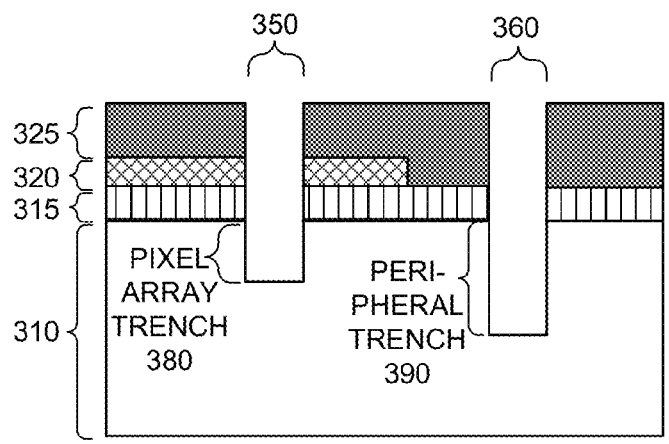

FIG. 3I illustrates a next part of the process. Starting with the build-up shown in FIG. 3H, an etchant that etches silicon etches the portions of silicon layer 310 underneath pixel array opening 350 and underneath peripheral opening 360, forming pixel array trench 380 in silicon layer 310 and extending the depth of peripheral opening 360 to form peripheral trench 390. Chlorine gas may be used as the etchant to etch silicon layer 310. Pixel array trench 380 may help electrically isolate pixels in a pixel array that will be formed in silicon layer 310. The newly etched pixel array trench 380 in silicon layer 310 is approximately the same width as, and is vertically aligned with, pixel array opening 350. Likewise, the newly etched extension of peripheral opening 360 is approximately the same width as, and is vertically aligned with, peripheral opening 360.

The silicon etchant utilized in the part of the process illustrated in FIG. 3I will etch each trench approximately the same depth because each trench is exposed to the etchant for approximately the same amount of time. Since peripheral trench 390 was previously etched to depth 345 (in the process described in FIG. 3F), peripheral trench 390 will be deeper by approximately depth 345.

Figure 3J:
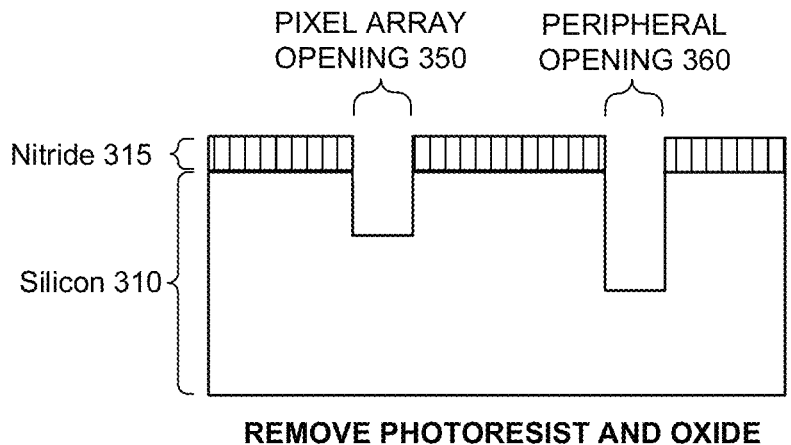
Figure 3K:
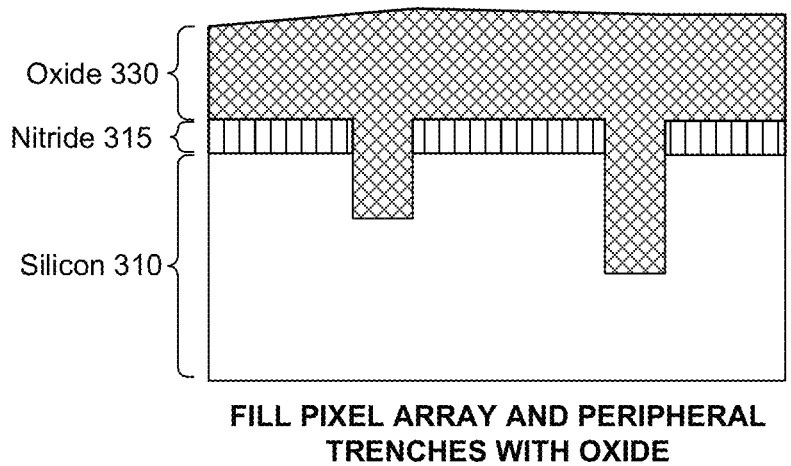
Figure 3L:
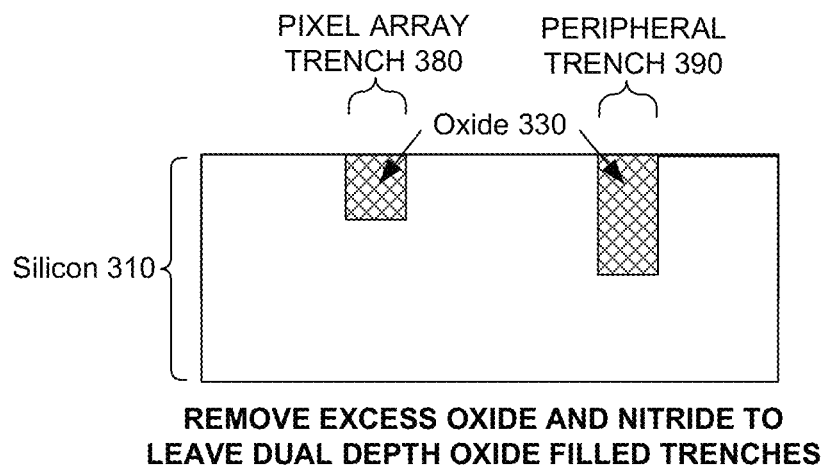

In FIG. 3J, photoresist layer 325 and oxide layer 320 are removed, leaving nitride layer 315, silicon layer 310, pixel array opening 350 and peripheral opening 360. In FIG. 3K, an oxide layer 330 is deposited over nitride layer 315 and into pixel array opening 350 and into peripheral opening 360. In FIG. 3L, excess oxide from oxide layer 330 is removed and nitride layer 315 is removed. The portions of oxide layer 330 that are above silicon layer 310 may be removed using chemical-mechanical-polishing ("CMP"). Silicon layer 310 is left with varying depth STI with pixel array trench 380 and peripheral trench 390 filled with oxide from oxide layer 330.

It may be desirable to have peripheral trench 390 be deeper than pixel array trench 380 to increase property isolation between peripheral circuits and pixels in the pixel array. Additionally, studies indicate that reducing the trench depth (and therefore the depth of STI) between pixels in the pixel array reduces the dark current in a pixel and decreases the incidence of white pixels in the pixel array. One potential benefit that the method depicted in FIGS. 3A-3L may offer is that it doesn't include filling one trench with photoresist material that has to be removed, as required in the global etch (FIGS. 1A-1G) or the double photo-double etch (FIGS. 2A-2G) methods. Hence, photoresist residue buildup in the varying depth trenches is decreased compared to the global etch and double photo-double etch methods.

Another potential benefits of the method depicted in FIGS. 3A-3L is that the wafer stays in the etch chamber throughout the trench forming process which includes at least FIG. 3E through FIG. 3I. Staying in the same chamber for the entire trench forming process (as opposed to moving in and out) may decrease the contamination that the wafer is exposed to and reduce the "handling loss," which may increase the wafer yield. Furthermore, the method depicted in FIGS. 3A-3L only requires a single photoetch process as the photoresist layer for both trenches is patterned at the same time (FIG. 3D). This may save on tooling cost.

Figure 4:
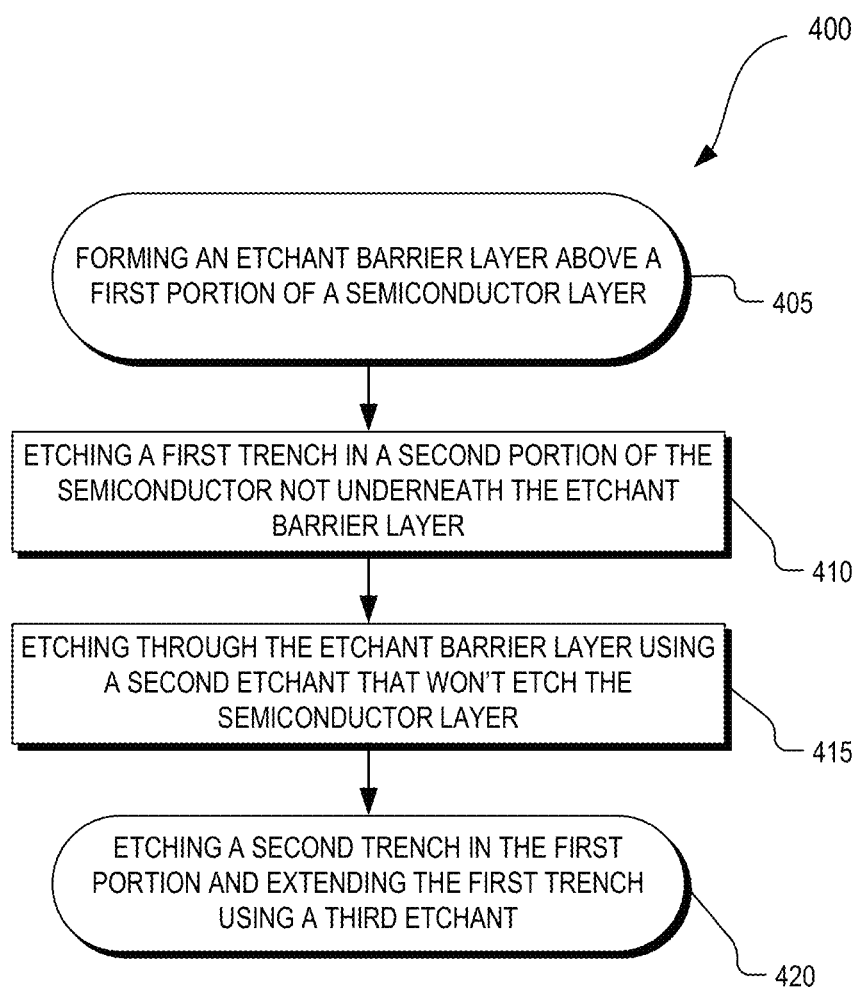
FIG. 4 is a flow chart illustrating a method of forming trenches of varying depths, in accordance with an embodiment of the disclosure.

FIG. 4 is a flow chart illustrating a method of forming trenches of varying depths, in accordance with an embodiment of the disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

In process block 405, an etchant barrier layer (e.g. oxide layer 320) is formed above a first portion of a semiconductor layer (e.g. silicon layer 310). In process block 410, a first trench (e.g. peripheral trench 390) is etched in a second portion of the semiconductor layer that is not underneath the etchant barrier layer. The chemical properties of the etchant used to etch the first trench may not be able to substantially etch the etchant barrier layer. In process block 415, at least a portion of the etchant barrier layer is etched through using a second etchant with chemical properties that will not substantially etch the semiconductor layer. A third etchant is used to etch a second trench in the first portion of the semiconductor layer and also extend the first trench deeper into the semiconductor layer (process block 420).

Figure 5:
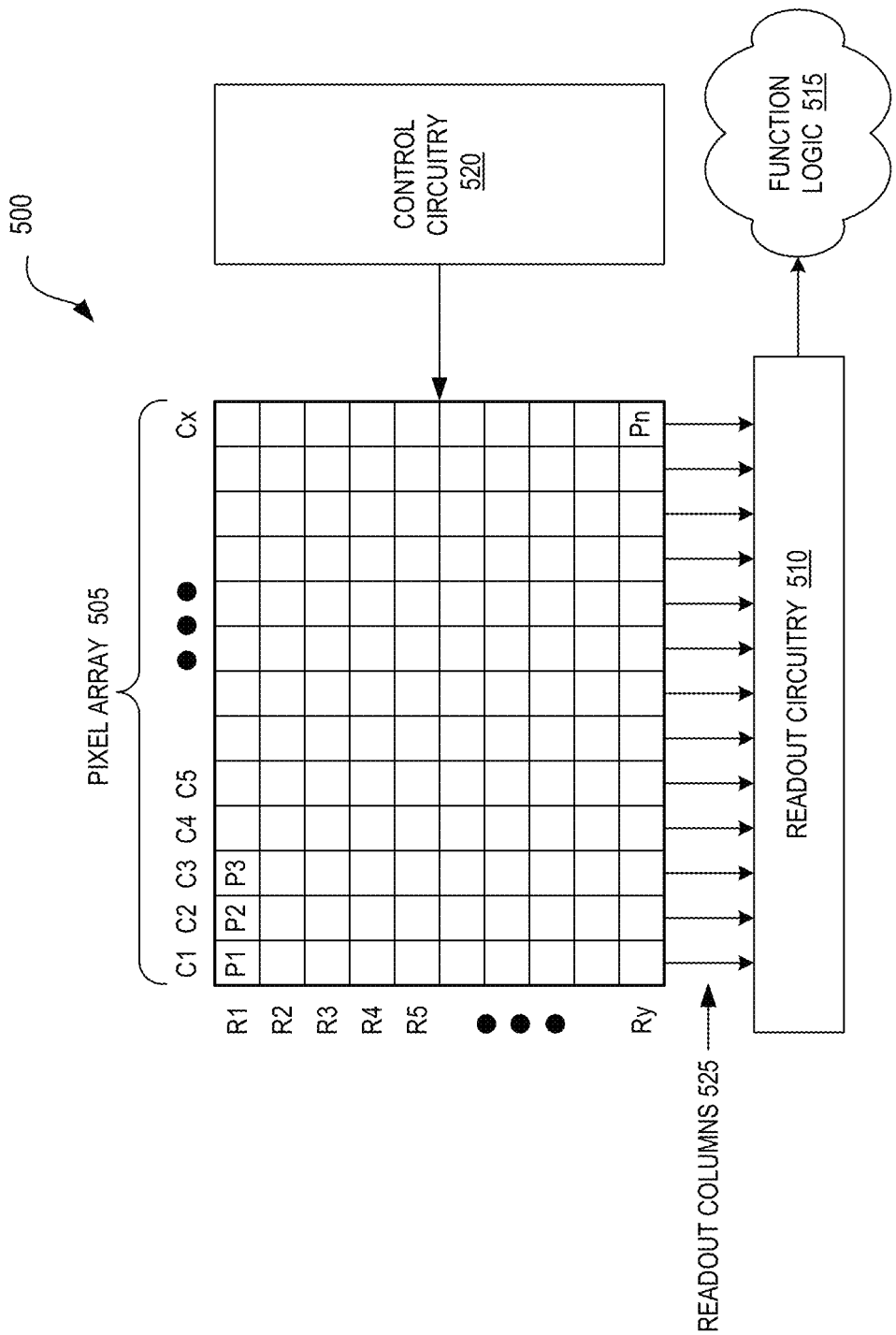
FIG. 5 is a block diagram illustrating an image sensor, in accordance with an embodiment of the disclosure.

FIG. 5 is a block diagram of an example embodiment of an image sensor 500, in accordance with an embodiment of the disclosure. Image sensor 500 may be one semiconductor device that could benefit from the methods described in the disclosure. The illustrated embodiment of image sensor 500 includes a pixel array 505, readout circuitry 510, function logic 515, and control circuitry 520. Pixel array 505, readout circuitry 510, function logic 515, and control circuitry 520 may be disposed in silicon layer 310. In one embodiment, readout circuitry 510, function logic 515, and control circuitry 520 are peripheral circuits. Peripheral trench 390 may electrically isolate readout circuitry 510, function logic 515, and control circuitry 520 from pixel array 505.

Pixel array 505 includes a two-dimensional array of pixels (e.g. pixels P1, P2, P3, . . . Pn). As illustrated, the pixels of the image sensor array are arranged into rows (e.g., rows R1 through Ry) and columns (e.g., column C1 through Cx). Commonly there are numerous rows and numerous columns. During image acquisition, each of the pixels may acquire image data (e.g., an image charge). In one embodiment, each pixel is a complementary metal oxide semiconductor (CMOS) pixel. In another embodiment, each pixel is a charge coupled device (CCD) type pixel.

After each pixel has acquired its image data or image charge, the image data is readout by readout circuitry 510 and transferred to function logic 515. The readout circuitry may readout a row of image data at a time along readout column lines 525, or readout the image data using column readout, serial readout, full parallel readout of all pixels concurrently, etc. Function logic 515 may be implemented in hardware, software, firmware, or a combination. Control circuitry 520 is coupled to pixel array 505 to control operational characteristics of the pixel array. For example, the control circuitry may generate a shutter signal for controlling image acquisition. The shutter signal may be a global shutter signal or a rolling shutter signal.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of forming trenches in a semiconductor layer of an image sensor, the method comprising:
 forming a first layer of a first material over the semiconductor layer of a wafer;
 forming a second layer of a second material over a first portion of the first layer, wherein the second material is an oxide;
 forming a first opening through the first layer by exposing the wafer to a first etchant that etches the first material, but does not substantially etch the second material;
 extending the first opening into the semiconductor layer to form a first trench by exposing the wafer to a second etchant, wherein neither the first opening nor the first trench extend through the second layer;
 forming a second opening through the second layer by exposing the wafer to a third etchant that does not substantially etch the semiconductor layer, wherein the wafer is exposed to the second etchant that extends the first opening prior to being exposed to the third etchant that forms the second opening, the third etchant being a wet etchant;
 extending the second opening by exposing the wafer to a fourth etchant that etches the first layer but does not substantially etch the semiconductor layer; and
 extending the first trench and forming a second trench in the semiconductor layer below the second opening by exposing the wafer to a fifth etchant.

2. The method of claim 1, further comprising forming a photoresist layer above the first and second layer, wherein the photoresist layer has a pattern that includes:
 a first gap in the photoresist layer that exposes a second portion of the first layer and is vertically aligned with the first opening; and
 a second gap in the photoresist layer that exposes a third portion of the second layer and is vertically aligned with the second opening.

3. The method of claim 2, wherein the first gap in the photoresist layer and the second gap in the photoresist layer are both formed by a single photo etch process.

4. The method of claim 1, wherein the second trench in the semiconductor layer is to be between pixels of a pixel array disposed in the semiconductor layer, and wherein the first trench in the semiconductor layer is to be between the pixel array and a peripheral circuit region disposed in the semiconductor layer, the first trench being deeper than the second trench and the peripheral circuit region controlling the pixel array.

5. The method of claim 1, wherein the wafer stays in an etch chamber from when the wafer is exposed to the first etchant to when the wafer is exposed to the fifth etchant.

6. The method of claim 1, further comprising:
 filling the first trench and the second trench with a dielectric material;
 removing excess of the dielectric material; and
 removing the first layer.

7. The method of claim 6, wherein the dielectric material is oxide and chemical mechanical polishing ("CMP") is used to remove the dielectric material.

8. The method of claim 1, wherein the first material is nitride and the semiconductor layer is silicon, and wherein the first etchant and the fourth etchant is fluorine gas, and the second etchant and the fifth etchant is chlorine gas.

9. A method of forming trenches in a semiconductor device, the method comprising:
 forming an etchant barrier layer above a first portion of a semiconductor layer, wherein the etchant barrier layer is oxide;
 forming a first layer between the semiconductor layer and the etchant barrier layer, wherein the first layer is made from a different material than the etchant barrier layer and the semiconductor layer, the first layer having a second portion disposed underneath the etchant barrier layer and a third portion not disposed underneath the etchant barrier layer;
 etching through the third portion of the first layer using a first etchant that does not etch through the etchant barrier layer;
 etching a first trench in a fourth portion of the semiconductor layer using a second etchant, wherein the fourth portion of the semiconductor layer is not disposed underneath the etchant barrier layer, and wherein etching through the third portion comes before etching the first trench;
 etching through the etchant barrier layer using a third etchant that does not substantially etch the semiconductor layer, wherein using the third etchant is subsequent to using the second etchant, and wherein the third etchant is a wet etch;
 etching through the second portion of the first layer using a fourth etchant, wherein etching through the second portion follows etching through the etchant barrier layer; and
 etching a second trench in the first portion of the semiconductor layer using a fifth etchant, wherein the fifth etchant extends a depth of the first trench.

10. The method of claim 9, wherein the semiconductor device is an image sensor and the second trench is for shallow trench isolation ("STI") between image pixels of a pixel array disposed in the image sensor, and wherein the first trench is for STI between a peripheral circuit region of the image sensor and the pixel array, the peripheral circuit region controlling the pixel array.

11. The method of claim 9, further comprising forming a photoresist layer above the first portion and the fourth portion of the semiconductor layer, wherein the photoresist layer has a pattern that includes gaps in the photoresist layer that determine widths of the first and second trench.

12. The method of claim 11, wherein the gaps in the photoresist layer include:
 a first gap in the photoresist layer that is vertically aligned with the first trench; and
 a second gap in the photoresist layer that is vertically aligned with the second trench, wherein the first gap in the photoresist layer and the second gap in the photoresist layer are both formed by a single photo etch process.

13. The method of claim 9, wherein the first layer is nitride and the semiconductor layer is silicon, and wherein the second and fifth etchant is chlorine gas, and the first and fourth etchant is fluorine gas.

14. The method of claim 9, wherein the semiconductor layer and the etchant barrier layer are part of a wafer that stays in an etch chamber from using the first etchant until using the fifth etchant.

15. The method of claim 9, wherein the first trench is deeper than the second trench.

16. The method of claim 9, further comprising filling the first trench and the second trench with a dielectric material to achieve shallow trench isolation ("STI").

* * * * *